(12) United States Patent
Kwon et al.

(10) Patent No.: US 12,512,328 B2
(45) Date of Patent: Dec. 30, 2025

(54) METHOD OF PROCESSING SUBSTRATE

(71) Applicant: TES Co., Ltd, Yongin-si (KR)

(72) Inventors: Bong-Soo Kwon, Yongin-si (KR); Se-Chan Kim, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 562 days.

(21) Appl. No.: 17/958,830

(22) Filed: Oct. 3, 2022

(65) Prior Publication Data

US 2023/0107815 A1 Apr. 6, 2023

(30) Foreign Application Priority Data

Oct. 6, 2021 (KR) .......................... 10-2021-0132139

(51) Int. Cl.
*H01L 21/311* (2006.01)

(52) U.S. Cl.
CPC .............................. *H01L 21/31116* (2013.01)

(58) Field of Classification Search
CPC ......... H01L 21/31116; H01L 21/02164; H01L 21/0217
See application file for complete search history.

(56) References Cited

U.S. PATENT DOCUMENTS

| | | | | |
|---|---|---|---|---|
| 6,362,109 B1* | 3/2002 | Kim | ................... | H01L 21/76802 438/719 |
| 6,500,768 B1* | 12/2002 | Shields | ............. | H01L 21/31116 257/E21.252 |
| 6,562,683 B1* | 5/2003 | Wang | ................ | H01L 21/31116 257/E21.258 |
| 8,034,690 B2* | 10/2011 | Shih | .................... | H01L 21/3081 438/689 |
| 9,165,786 B1* | 10/2015 | Purayath | ............ | H10D 30/0413 |
| 11,521,846 B2* | 12/2022 | Wang | ................ | H01L 21/02164 |
| 2001/0034135 A1* | 10/2001 | Miyakawa | ........ | H01L 21/76897 257/E21.507 |
| 2002/0016081 A1* | 2/2002 | Aloni | ................... | H10D 84/038 257/E21.252 |

(Continued)

FOREIGN PATENT DOCUMENTS

| | | |
|---|---|---|
| CN | 101636834 B | 2/2012 |
| CN | 108693713 A | 10/2018 |

(Continued)

OTHER PUBLICATIONS

Taiwanese Office Action for related TW Application No. 111130970 mailed Jan. 2, 2024 from Taiwan Intellectual Property Office.

(Continued)

*Primary Examiner* — Joshua L Allen
*Assistant Examiner* — Christopher Remavege
(74) *Attorney, Agent, or Firm* — Paratus Law Group, PLLC

(57) ABSTRACT

A method of processing a substrate on which films comprising a first silicon oxide film, a silicon nitride film and a second silicon oxide film are stacked from an outermost side, includes: a first etching step of etching the first silicon oxide film; and a second etching step of etching the silicon nitride film and the second silicon oxide film. In the first etching step, a residual layer of the first silicon oxide film is left. In the second etching step, the residual layer of the first silicon oxide film, the silicon nitride film and the second silicon oxide film are etched together.

20 Claims, 6 Drawing Sheets

(56) References Cited

U.S. PATENT DOCUMENTS

| | | | |
|---|---|---|---|
| 2002/0098706 A1 | 7/2002 | Hirohama et al. | |
| 2008/0124937 A1* | 5/2008 | Xu | H01L 21/31116 257/E21.252 |
| 2012/0083127 A1* | 4/2012 | Clark | H01L 21/31116 257/E21.214 |
| 2015/0097276 A1* | 4/2015 | Kim | H10D 30/0413 257/635 |
| 2015/0357200 A1* | 12/2015 | Inui | H01L 21/31144 438/706 |
| 2017/0200793 A1* | 7/2017 | Lian | H01L 21/02274 |
| 2018/0076048 A1* | 3/2018 | Gohira | H01L 21/31116 |
| 2019/0013207 A1 | 1/2019 | Kobayashi et al. | |
| 2020/0035504 A1* | 1/2020 | Abe | H01L 21/3065 |
| 2020/0105583 A1* | 4/2020 | Wang | H10D 84/834 |
| 2020/0350199 A1* | 11/2020 | Chang | H01L 21/02329 |
| 2024/0006187 A1* | 1/2024 | Debari | H01L 21/67069 |

FOREIGN PATENT DOCUMENTS

| | | |
|---|---|---|
| JP | 2008-010724 A | 1/2008 |
| JP | 2020-025070 A | 2/2020 |
| KR | 10-2000-0044885 A | 7/2000 |
| KR | 10-2001-0046059 A | 6/2001 |
| KR | 10-2004-0102411 A | 12/2004 |
| KR | 10-0823461 B1 | 4/2008 |
| KR | 10-2008-0060361 A | 7/2008 |
| TW | 202032656 A | 9/2020 |

OTHER PUBLICATIONS

Korean Notice of Allowance for related KR Application No. 10-2021-0132139 mailed Feb. 27, 2025 from Korean Intellectual Property Office.

Chinese Office Action for related CN Application No. 202211200674.7 mailed Nov. 1, 2025 from China National Intellectual Property Administration.

* cited by examiner

METHOD OF PROCESSING SUBSTRATE

CROSS-REFERENCE TO RELATED APPLICATION

This application claims priority to and the benefit of Korean Patent Application No. 10-2021-0132139, filed on Oct. 6, 2021, which is hereby incorporated by reference in its entirety.

BACKGROUND

Disclosed herein is a method of processing a substrate. In particular, disclosed herein is a method of processing a substrate in which when a silicon nitride film and a silicon oxide film are stacked on a substrate, a silicon nitride film and a silicon oxide film in an area to be etched can be etched together based on a dry etching method.

As semiconductor elements are micronized recently, the semiconductor elements are highly integrated. Silicon nitride films are used as a dielectric film or an insulating film that is chemically stable, and further widely used in the processes of manufacturing DRAM and flash memory, while being used as a material for a sidewall in the contact process or the capping process, as well as in a basic process of separating an element of a memory element, and the like.

In some cases, a silicon oxide film and a silicon nitride film are stacked in a plurality of layers on a substrate at a time of manufacturing a semiconductor element. At this time, to etch the silicon oxide films and the silicon nitride films, a plurality of etching processes needs to be performed.

FIGS. 1A to 1D are views schematically showing a method of processing a substrate in the related art, which comprises a process of etching a silicon oxide film and a process of etching a silicon nitride film.

Referring to FIGS. 1A to 1D, the method of processing a substrate in the related art includes the following steps to etch silicon oxide films 110, 130 and a silicon nitride film 120 in an area to be etched, on a substrate 101 (FIG. 1A) on which the lower silicon oxide film 110, the silicon nitride film 120 and the upper silicon oxide film 130 are stacked.

A first etching process involves etching the upper silicon oxide film 130 in the area to be etched with the dry etching method (FIG. 1B). In an area to be non-etched, a silicon nitride film 140 and films thereunder are formed. A second etching process involves etching the silicon nitride film 120 with the wet etching method (FIG. 1C). A third etching process involves etching the lower silicon oxide film 110 with the dry etching method (FIG. 1D).

In the method of processing a substrate in the related art, the first etching process (FIG. 1B) of etching the upper silicon oxide film, the second etching process (FIG. 1C) of etching the silicon nitride film and the third etching process (FIG. 1D) of etching the lower silicon oxide film need to be performed respectively. Additionally, the silicon nitride film is etched mainly with the wet etching method while the upper and lower silicon oxide films are etched with the dry etching method. The etching processes cannot be performed in the same chamber. This causes an increase in the time taken for the etching processes and the processing costs.

To solve the problems, an etching liquid has been developed to evenly etch a silicon oxide film and a silicon nitride film (see KR Patent No. 10-0823461).

FIGS. 2A and 2B are views showing an example of the etching of a silicon oxide film and a silicon nitride film in a single etching process.

Referring to FIGS. 2A and 2B, a single process of etching the silicon oxide film and the silicon nitride film involves etching silicon oxide films 110, 130 and a silicon nitride film 120 together in a substrate 101 (FIG. 2A) on which the lower silicon oxide film 110, the silicon nitride film 120 and the upper silicon oxide film 130 are stacked with an etching liquid capable of etching both the silicon oxide film and the silicon nitride film.

In the wet etching method, the etching liquid filtrates into an element pattern due to surface tension, or etching is not properly performed up to the lower most film. The problem gets worse as the number of the layers of semiconductor elements increases and patterns are micronized.

SUMMARY

The objective of the present disclosure is to provide a method of processing a substrate in which when a silicon nitride film and a silicon oxide film are stacked on a substrate, the silicon nitride film and the silicon oxide film are etched together.

The objective of the present disclosure is also directed to a method processing a substrate in which films in an area to be non-etched are protected while a silicon nitride film and a silicon oxide film in an area to be etched are etched together.

In the first embodiment, a method of processing a substrate on which films comprising a first silicon oxide film, a silicon nitride film and a second silicon oxide film are stacked from an outermost side, comprises: a first etching step of etching the first silicon oxide film; and a second etching step of etching the silicon nitride film and the second silicon oxide film, wherein in the first etching step, a residual layer of the first silicon oxide film is left, and in the second etching step, the residual layer of the first silicon oxide film, the silicon nitride film and the second silicon oxide film are etched together.

The first etching step and the second etching step may be performed in the same chamber.

The first etching step may be performed until a thickness of the residual layer of the first silicon oxide film is less than a maximum thickness of the first silicon oxide film that is removable when the first silicon oxide film is etched once under the same conditions as those in the second etching step.

The second etching step may be performed according to a dry etching method in which a mixed gas comprising hydrogen fluoride (HF) gas and ammonia ($NH_3$) gas or a mixed gas comprising nitrogen trifluoride (NF3) gas and ammonia ($NH_3$) gas or hydrogen ($H_2$) gas is plasmatized.

The second etching step may comprise repeating a unit cycle that is comprised of etching and heating, a plurality of times.

The method may further comprise a final heating step of increasing a temperature of the substrate to 200° C. or greater, preferably, 200 to 250° C. after the second etching step.

In the second embodiment, a method of processing a substrate on which films comprising a first silicon oxide film, a first silicon nitride film and a second silicon oxide film are consecutively stacked from an outermost side in a first area to be etched, and on which one or more films comprising a second silicon nitride film are stacked from an outermost side in a second area to be non-etched, comprises: a first etching step of etching the first silicon oxide film in the first area; and a second etching step of etching the first silicon nitride film and the second silicon oxide film in the first area at a temperature greater than that of the first etching step, wherein in the first etching step, a residual layer of the first silicon oxide film in the first area is left, and in the second etching step, the residual layer of the first silicon oxide film, the first silicon nitride film and the second silicon oxide film in the first area are etched together, and the second silicon nitride film in the second area acts as an etch stopper.

In the third embodiment, a method of processing a substrate on which films comprising a first silicon oxide film, a first silicon nitride film and a second silicon oxide film are consecutively stacked from an outermost side in a first area to be etched, and on which films comprising a third silicon oxide film and a second silicon nitride film are stacked from an outermost side in a second area to be non-etched, comprises: a first etching step of etching the first silicon oxide film in the first area and the third silicon oxide film in the second area; and a second etching step of etching the first silicon nitride film and the second silicon oxide film in the first area at a temperature greater than that of the first etching step, wherein in the first etching step, a residual layer of the first silicon oxide film in the first area is left and the second silicon nitride film in the second area is exposed, and in the second etching step, the residual layer of the first silicon oxide film, the silicon nitride film and the second silicon oxide film in the first area are etched together and the second silicon nitride film in the second area acts as an etch stopper.

The first etching step and the second etching step may be performed in the same chamber.

The first etching step may be performed until a thickness of the residual layer of the first silicon oxide film is less than a maximum thickness of the first silicon oxide film that is removable when the first silicon oxide film is etched once under the same conditions as those in the second etching step.

The second etching step may be performed according to a dry etching method in which a mixed gas comprising hydrogen fluoride (HF) gas and ammonia ($NH_3$) gas or a mixed gas comprising nitrogen trifluoride (NF3) gas and ammonia ($NH_3$) gas or hydrogen ($H_2$) gas is plasmatized.

The second etching step may be performed at 60° C. or greater.

The second etching step may comprise repeating a unit cycle that is comprised of etching and heating, a plurality of times.

The method may further comprise a final heating step of increasing a temperature of the substrate to 200° C. or greater after the second etching step.

In the fourth embodiment, a method of processing a substrate on which films comprising a first silicon nitride film and a silicon oxide film are consecutively stacked from an outermost side in a first area to be etched, and on which one or more films comprising a second silicon nitride film are stacked from an outermost side in a second area to be non-etched, comprises: a sacrificial silicon oxide film forming step of forming a sacrificial silicon oxide film on the first silicon nitride film in the first area; and an etching step of etching the first silicon nitride film and the silicon oxide film in the first area, wherein in the etching step, the sacrificial silicon oxide film, the first silicon nitride film and the silicon oxide film in the first area are etched together, and the second silicon nitride film in the second area acts as an etch stopper.

The sacrificial silicon oxide film forming step may be performed so that a thickness of the sacrificial silicon oxide film is less than a maximum thickness of the sacrificial silicon oxide film that is removable when the sacrificial silicon oxide film is etched once under the same conditions as those in the etching step.

The etching step may be performed according to a dry etching method in which a mixed gas comprising hydrogen fluoride (HF) gas and ammonia ($NH_3$) gas or a mixed gas comprising nitrogen trifluoride (NF3) gas and ammonia ($NH_3$) gas or hydrogen ($H_2$) gas is plasmatized.

The etching step may be performed at 60° C. or greater.

The etching step may comprise repeating a unit cycle that is comprised of etching and heating, a plurality of times.

The method may further comprise a final heating step of increasing a temperature of the substrate to 200° C. or greater after the etching step.

In a method of processing a substrate according to the present disclosure, a silicon nitride film and a silicon oxide film may be etched together in the same chamber according to a dry etching method when the silicon nitride film and the silicon oxide film are stacked on a substrate.

In the method of processing a substrate according to the present disclosure, a silicon nitride film and a silicon oxide film in an area to be etched may be etched together with the silicon nitride film that acts as an etch stopper at high temperature when the silicon nitride film is exposed while films in an area to be non-etched may be protected.

Aspects according to the present disclosure are not limited to the above ones, and other aspects and advantages that are not mentioned above can be clearly understood one having ordinary skill in the art from the following description.

BRIEF DESCRIPTION OF DRAWINGS

The accompanying drawings constitute a part of the specification, illustrate one or more embodiments in the disclosure, and together with the specification, explain the disclosure, wherein.

DETAILED DESCRIPTION

Figure 1A:
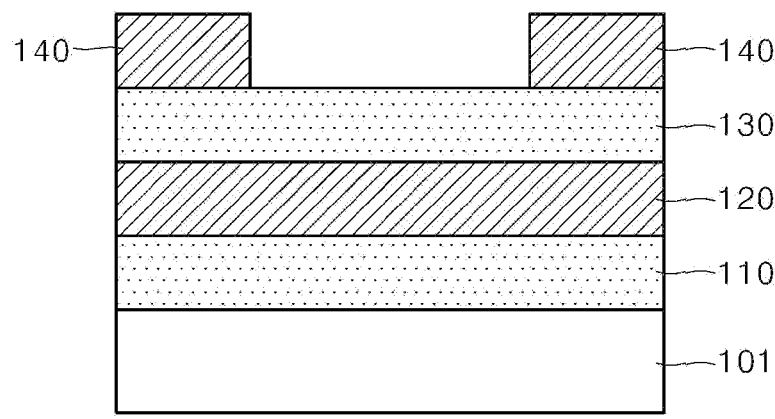
FIGS. 1A to 1D are views schematically showing a method of processing a substrate in the related art, which comprises a process of etching a silicon oxide film and a process of etching a silicon nitride film.
Figure 1B:
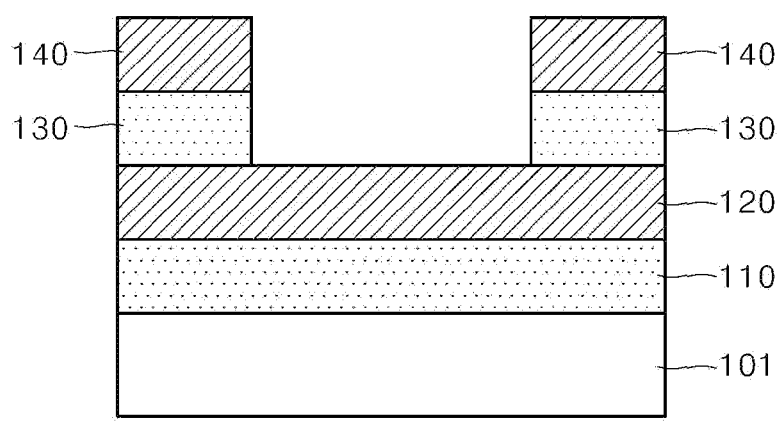
Figure 1C:
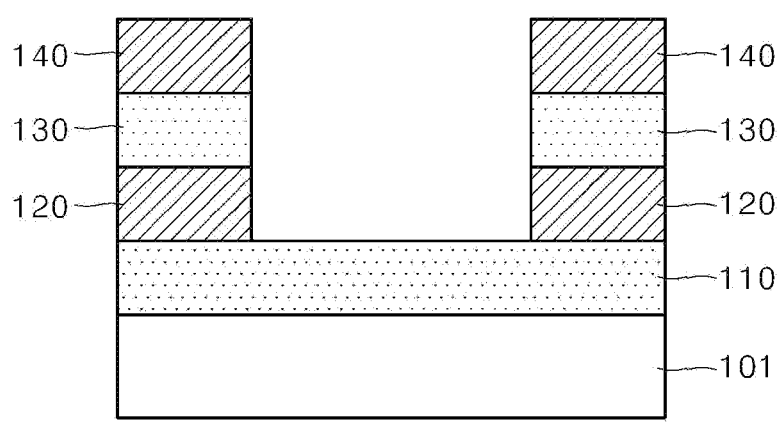
Figure 1D:
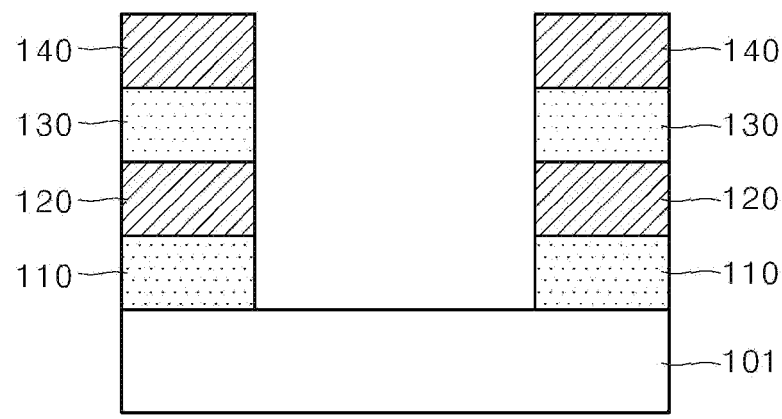
Figure 2A:
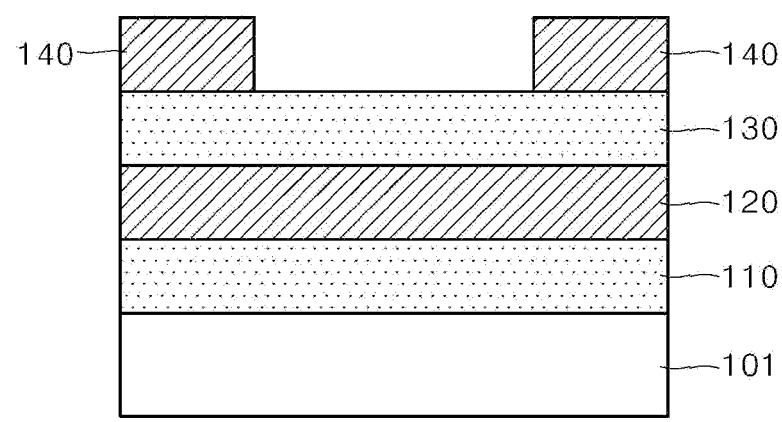
FIGS. 2A and 2B are views showing an example of the etching of a silicon oxide film and a silicon nitride film in a single etching process.
Figure 2B:
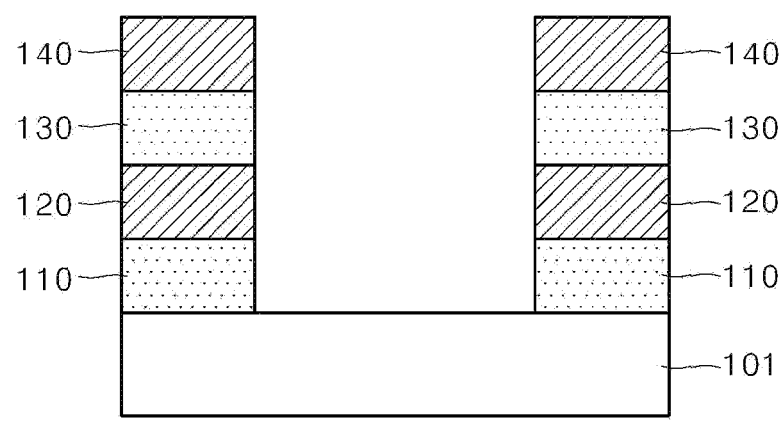

Advantages and features in the present disclosure and methods of ensuring the same can be clearly understood from embodiments that are described with reference to the accompanying drawings. The subject matter of the present disclosure, however, can be embodied in various different forms, and should not be construed as being limited to the embodiments set forth herein. Rather, the embodiments are provided as examples so that the present disclosure can be thorough and complete and that the scope of the disclosure can be fully conveyed to one having ordinary skill in the art. The subject matter of the present disclosure should be defined only according to the scope of the appended claims. Throughout the disclosure, identical reference numerals can denote identical or similar components. In the drawings, the sizes and relative sizes of layers and areas can be exaggerated for clarity of description.

When one component or layer is described as being disposed "in the upper portion" or "on" another component or layer, one component or layer can be directly on another component or layer, and an additional component or layer can be interposed between the two components or layers. When one component or layer is described as being disposed "directly or right in the upper portion" or "directly or right on" another component or layer, an additional component or layer cannot be interposed between the two components or layers. When any one component is described as being "connected", "coupled", or "connected" to another component, any one component can be directly connected or coupled to another component, but an additional component can be "interposed" between the two components or the two components can be "connected", "coupled", or "connected" by an additional component.

In the disclosure, spatial relative terms such as "under", "in a lower portion", "on", "in an upper portion" and the like are used to easily describe a position relationship between one element or component and another element or component. The spatial relative terms are to be understood as implying same or opposite directions of elements when in use or in operation in addition to their directions illustrated in the drawings. For example, when one element in the drawings is overturned, one element described as 'being under" another element can be understood as "being on" another element. Accordingly, the exemplary term "under" can imply both the upward and downward directions.

The terms in the present disclosure are used to describe the embodiments and are not intended to limit the subject matter of the disclosure. Throughout the disclosure, the singular forms "a", "an" and "the" are intended to include the plural forms as well, unless explicitly indicated otherwise. It is to be understood that the terms "comprise" and/or "include", set forth herein, are used to indicate the presence of stated components, steps, operations and/or elements and do not imply the exclusion of one or more additional components, steps, operations and/or elements.

Hereafter, a method of processing a substrate in preferred embodiments of the present disclosure is described with reference to the accompanying drawings.

The etching reaction in relation to a silicon nitride is performed in the following processes.

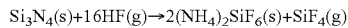

The etching reaction of a silicon oxide differs from the etching reaction of a silicon nitride depending on whether H$_2$O is produced. In relation to a silicon oxide, H$_2$O is produced, and etching is accelerated, while in relation to a silicon nitride, there is no oxygen (O) ingredient, and basically, etching is carried out slowly.

Regarding a pure silicon nitride, etching is not performed well by HF. However, it turned out that when the oxygen (O) ingredient is present on the surface of a silicon nitride, the silicon nitride's inside that substantially has no oxygen ingredient as well as the silicon nitride's surface that has the oxygen ingredient were etched by HF. Additionally, it was found that after the silicon nitride's surface having the oxygen ingredient was etched and desalinated, a pure silicon nitride surface was formed, and then the silicon nitride was rarely etched even in additional HF-based etching.

Figure 3A:
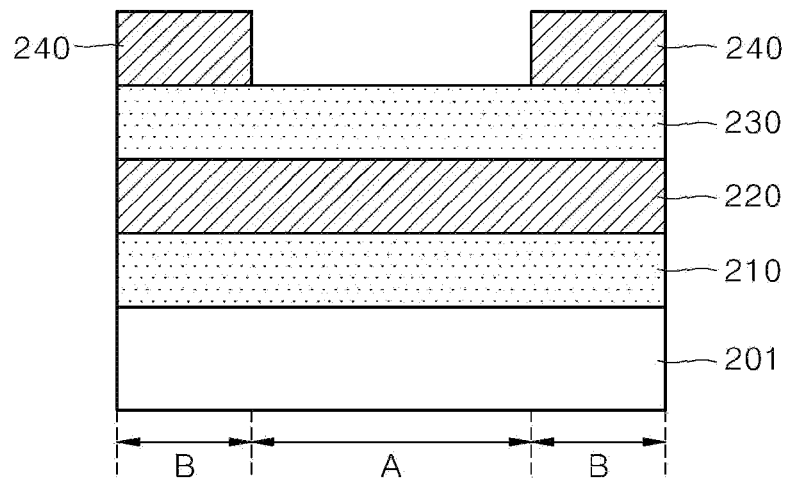
FIGS. 3A to 3C are views schematically showing a method of processing a substrate in an embodiment of the present disclosure.
Figure 3B:
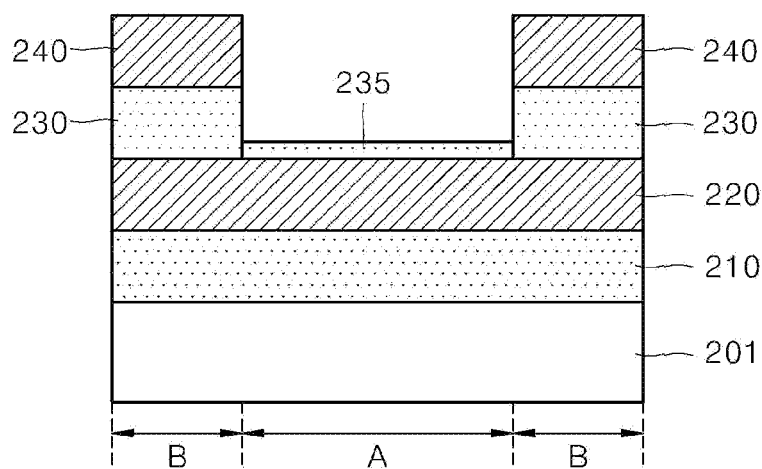
Figure 3C:
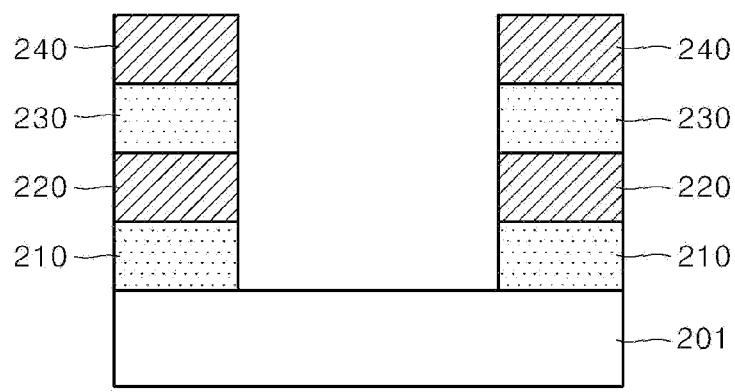

FIGS. 3A to 3C are views schematically showing a method of processing a substrate in an embodiment of the present disclosure.

Referring to FIGS. 3A to 3C, the method of processing a substrate in the embodiment of the present disclosure comprises a first etching step (FIG. 3B) and a second etching step (FIG. 3C).

In the embodiment, a substrate to be processed is a substrate 201 where films comprising a first silicon oxide film 230, a silicon nitride film 220, and a second silicon oxide film 210 are stacked from the outermost side, as illustrated in the example of FIG. 3A. In addition to the above films 210, 220, 230, films, which are not to be etched, such as a second silicon nitride film 240 may be additionally stacked on the substrate.

In the present disclosure, the term "stack" denotes a horizontal stack as well as a perpendicular stack. Accordingly, the term "outermost side" may denote the outermost side in the horizontal direction as well the uppermost side in the perpendicular direction.

Additionally, additional films such as an oxide film, a nitride film, and a metal film and the like may be disposed between the substrate 201 and the second silicon oxide film 210. FIG. 3A shows the second silicon oxide film 210, the silicon nitride film 220, the first silicon oxide film 230 and the second silicon nitride film 240 that are disposed on the substrate 201. Hereafter, the etching of the first silicon oxide film 230, the silicon nitride film 220 and the second silicon oxide film 210 are mainly explained. In case a silicon nitride film and a silicon oxide film are additionally stacked under the second silicon oxide film 210, the silicon nitride film and the silicon oxide film are also objects to be etched.

Further, in FIG. 3A, area A is an area to be etched, and area B is an area to be non-etched. Areas A and B may be adjacent to each other or spaced from each other. When area A and area B are spaced from each other, any silicon oxide film in area A and any silicon oxide film in area B may be formed as the same layer or different layers, for example.

Referring to FIG. 3B, in the first etching step, the first silicon oxide film is etched.

Before the first etching step, a preliminary etching step may be performed with ammonia gas and carrier gas without HF gas, for example.

The first etching step may be performed according to the dry etching method in which a mixed gas comprising hydrogen fluoride (HF) and ammonia (NH$_3$) is plasmatized, for example. The first etching step may be performed at 60° C. or greater, for a high-speed cycle process.

To ensure process efficiency, the first etching step is carried out in one cycle, but not limited. As long as the silicon nitride film 220 under the first silicon oxide film 230 is not exposed, the first etching step may be performed in one cycle or in n (n≥2) cycles.

Then, referring to FIG. 3C, in the second etching step, the silicon nitride film 220 and the second silicon oxide film 210 are etched. The second etching step may be performed according to the dry etching method in which a mixed gas comprising hydrogen fluoride (HF) gas and ammonia (NH$_3$) gas or a mixed gas comprising nitrogen trifluoride (NF3) gas and ammonia (NH$_3$) gas or hydrogen (H$_2$) gas is plasmatized.

The first etching step and the second etching step may be performed at the process pressure of hundreds of mTorrs to a few Torrs but not limited.

Additionally, in the first etching step and the second etching step, the same etching gas may be used. For example, in the first etching step and the second etching step, a mixed gas may be used at a flow rate ratio of HF to $NH_3$, which is 1:1 to 3:1, preferably, 1:1 to 2:1, more preferably, 1.3:1 to 1.7:1.

Furthermore, the total flow rate or the total process pressure applied to the first etching step and the second etching step may differ. For example, the first etching step may be performed at the process pressure of about 1.2 Torrs, and the second etching step may be performed at the process pressure of about 0.8 Torr. Further, the flow rate of etching gas in the second etching step may be about 30% greater than in the first etching step.

In the present disclosure, as illustrated in FIG. 3B, a residual layer 235 of the first silicon oxide film is left in the first etching step, and the residual layer 235 of the first silicon oxide film, and the silicon nitride film 220 and the second silicon oxide film 210 are etched together, in the second etching step. At this time, the term "residual layer of the first silicon oxide film" corresponds to the "non-etched lower portion of the first silicon oxide film", and the silicon nitride film under the non-etched lower portion of the first silicon oxide film may be deemed not to be exposed.

The applicant of the present disclosure found that when a thin silicon oxide film of about tens of Å was exposed at a time of dry etching using etching gas (e.g., hydrogen fluoride gas and ammonia gas) capable of etching both the silicon oxide film and the silicon nitride film, a silicon nitride film under the silicon oxide film and another silicon oxide film both could be etched after a long-term study. The applicant also found that when a thick silicon oxide film was exposed, the etching speed of the silicon oxide film was slow, and as a result, a silicon nitride film under the silicon oxide film and another silicon oxide film were not sufficiently etched.

Additionally, the inventors found that when a silicon nitride film was exposed, the silicon nitride film acted as an etching stopper that almost prevents etching at high temperature.

Referring back to FIGS. 3B and 3C, in the method of processing a substrate according to the present disclosure, the first etching step involves leaving the residual layer 235 of the first silicon oxide film, and the second etching step involves the residual layer 235 of the first silicon oxide film, the silicon nitride film 220 and the second silicon oxide film 210 may be etched together.

In the present disclosure, as described above, the first etching step and the second etching step may both be performed based on the dry etching method. The first etching step and the second etching step may be performed in the same chamber with the same etching gas. Accordingly, the etching time and costs when the same chamber is used for the first etching step and the second etching step may be less than when different chambers are used for the first etching step and the second etching step.

The first etching step may be performed until the thickness of the residual layer 235 of the first silicon oxide film is less than a maximum thickness of the first silicon oxide film 230 that is removable when the first silicon oxide film 230 is etched once under the same conditions as those in the second etching step. The maximum thickness of the first silicon oxide 230 that is removable when the first silicon oxide film 230 is etched once may vary depending on etching gas, temperature, pressure and the like applied in the second etching step. Accordingly, the thickness of the residual layer 235 of the first silicon oxide film is not limited, but may be for example about 100 Å or less.

If the residual layer 235 of the first silicon oxide film is not left, the silicon nitride film 220 is exposed, and etching may not be performed properly in the second etching step.

Since the etching of a silicon oxide film entails a self-limiting reaction, when an etching step proceeds up to a predetermined thickness, the etching step does not proceed any more due to by-products of the reaction. When the residual layer 235 of the first silicon oxide film is too thick, the residual layer 235 of the first silicon oxide film is not etched completely in the second etching step. Thus, the silicon nitride film under the first silicon oxide film or the second silicon oxide film is etched insufficiently or unevenly. Additionally, since the residual layer of the first silicon oxide film is excessively etched, unwanted uneven etching is likely to occur.

The second etching step may be performed at a temperature the same or greater than that of the first etching step, preferably, at 60° C. or greater. The temperature of the second etching step has no upper limit, but may be 110° C. or less in terms of etching stability. When the silicon nitride film is exposed, the exposed silicon nitride film acts as an etch stopper at 60° C. or greater, and the exposed silicon nitride film and the etching of the films under the exposed silicon nitride film may be suppressed. Thus, in the second etching step, an additional mask may not be placed in the portion where the silicon nitride film (e.g., the second silicon nitride film 240 disposed in the area to be non-etched) is exposed.

Figure 4:
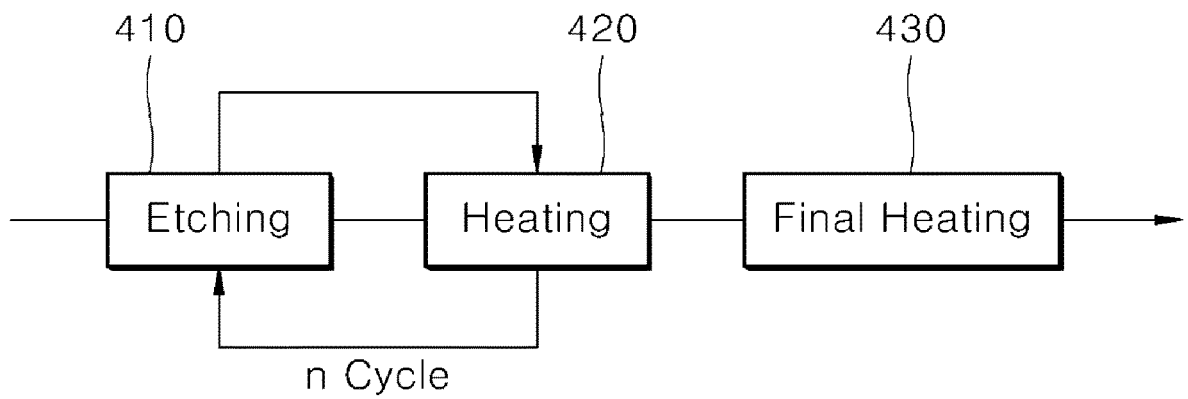
FIG. 4 is a view showing an example of an etching method applicable to a second etching step.

FIG. 4 is a view showing an example of an etching method applicable to a second etching step.

As illustrated in the example of FIG. 4, in the second etching step, a unit cycle in which etching 410 and heating 420 are included may be repeated a plurality of times. A purge of the inside of a chamber may be included between etching and heating (before or after heating). Heating may be denote turning on a lamp such that the temperature of the substrate is increased by injecting gas after etching to remove reaction byproducts. The heating step 420 may be performed by turning on a lamp to increase the temperature of the substrate to 60° C. or greater. For example, a lamp may be turned on for 30 seconds to increase the temperature of the substrate to about 120 to 200° C. Since the temperature of the substrate may gradually decease to 60° C. or less in the etching step 410, the unit cycle including etching 410 and heating may be repeated n (n≥2) times such that the second etching step is performed at a high enough temperature, e.g., 60° C. or greater, and the residual layer 235 of the first silicon oxide film, the silicon nitride film 220 and the second silicon oxide film 210 may be etched sufficiently.

A final heating step of increasing the temperature of the substrate to 200° C. or greater, e.g., 200 to 250° C., may be further comprised after the second etching step. This is helpful for fume management. Fume denotes particle-shaped $NH_4F$ or $NH_2F_2$ and the like that remains on the substrate as etching byproducts are not evaporated by heat completely. Such fumes may contaminate the surface of the film or the surface of equipment, causing deterioration in the reliability of fine pattern. To prevent this from happening, after the second etching step, the temperature of the substrate increases to 200° C. or greater in the final heating step, to suppress the residues of fumes after the etching step. However, the temperature of the substrate increases to 250° C. or less preferably in terms of facility reliability and process management. When the temperature of the substrate exceeds 250° C., equipment burden increases, and process reproductibility and abnormal etching are likely to occur.

Referring to FIG. 3A, in area B to be non-etched, the second silicon nitride film 240 is stacked. Since the second silicon nitride film 240 is exposed, the second silicon nitride film 240 is left without being etched while the residual layer 235 of the first silicon oxide film, the first silicon nitride film 220 and the second silicon oxide film 210 in area A are etched together in the second etching step. This is because the silicon nitride film serves as an etch stopper at high temperature, as described above.

Figure 5A:
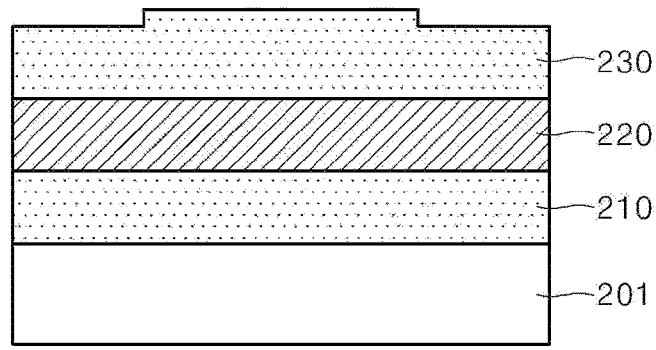
FIGS. 5A to 5C are views schematically showing the method of processing a substrate in an embodiment of the present disclosure.
Figure 5B:
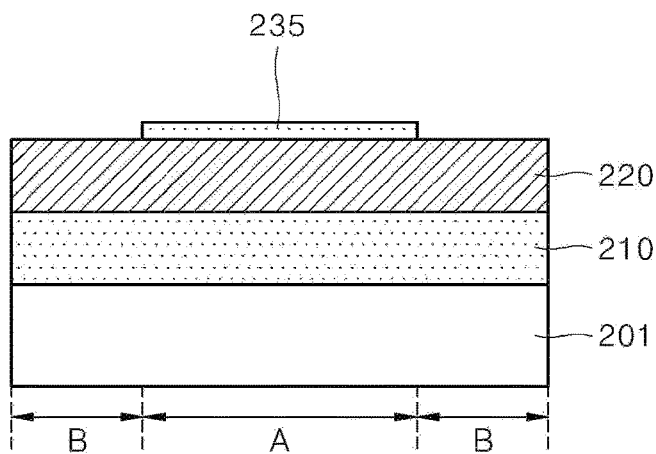
Figure 5C:
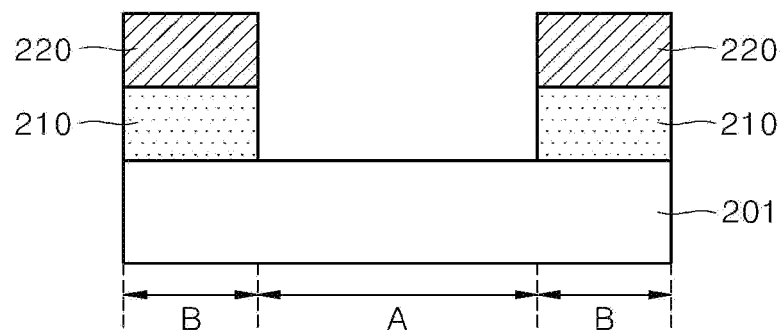

FIGS. 5A to 5C are views schematically showing the method of processing a substrate in an embodiment of the present disclosure.

Referring to FIGS. 5A to 5C, the illustrated method of processing a substrate involves processing a substrate on which films comprising a first silicon oxide film 230, a first silicon nitride film 220 and a second silicon oxide film 210 are consecutively stacked from the outermost side in a first area (area A) to be etched, and on which films comprising a third silicon oxide film 230 and a second silicon nitride film 220 are stacked from the outermost side in a second area (area B) to be non-etched, based on a first etching step and a second etching step. In FIG. 5A, the first silicon oxide film and the third silicon oxide film are formed as the same layer and given an identical reference numeral. And the first silicon nitride film and the second silicon nitride film are formed as the same layer and given an identical reference numeral.

In the first etching step, the first silicon oxide film in the first area (area A) and the third silicon oxide film in the second area (area B) are etched, as illustrated in the example of FIG. 5B.

In the second etching step, the first silicon nitride film 220 and the second silicon oxide film 210 in the first area (area A) are etched at a temperature greater than that of the first etching step, as illustrated in the example of FIG. 5C.

At this time, in the first etching step, a residual layer 235 of the first silicon oxide film in the first area (area A) is left, and the second silicon nitride film in the second area is exposed, as illustrated in the example of FIG. 5B. If the thickness of the first silicon oxide film is greater than the thickness of the third silicon oxide film by the thickness of the residual layer, the residual layer of the first silicon oxide film in the first area may only be left after the first etching step.

After the first etching step, the residual layer 235 of the first silicon oxide film, the silicon nitride film 220 and the second silicon oxide film 210 in the first area (area A) are etched together in the second etching step, and the second silicon nitride film 220 in the second area (area B) acts as an etch stopper such that the second silicon nitride film 220 and the films thereunder are almost not etched.

Features described with reference to FIGS. 3A to 3C may also be applied to the method of processing a substrate in the embodiment.

That is, since the first etching step and the second etching step may be performed respectively based on a dry etching method, the first etching step and the second etching step may be performed in the same chamber. Additionally, the first etching step may be performed until the thickness of the residual layer 235 of the first silicon oxide film is less than a maximum thickness of the first silicon oxide film 230 that is removable when the first silicon oxide film 230 is etched once under the same conditions as those in the second etching step. Further, the second etching step may be performed according to the dry etching method in which a mixed gas comprising hydrogen fluoride (HF) gas and ammonia ($NH_3$) gas or a mixed gas comprising nitrogen trifluoride ($NF_3$) gas and ammonia ($NH_3$) gas or hydrogen ($H_2$) gas is plasmatized.

Further, the second etching step may be performed at a temperature the same as or greater than that of the first etching step, and may be performed at 60° C. or greater. Further, the second etching step may involve repeating a unit cycle comprised of etching and heating a plurality of times. Furthermore, after the second etching step, a final heating step of increasing the temperature of a substrate to 200° C. or greater may be further comprised.

Figure 6A:
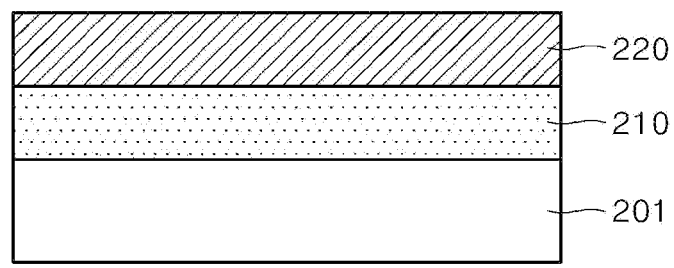
FIGS. 6A to 6C are views schematically showing the method of processing a substrate in an embodiment of the present disclosure.
Figure 6B:
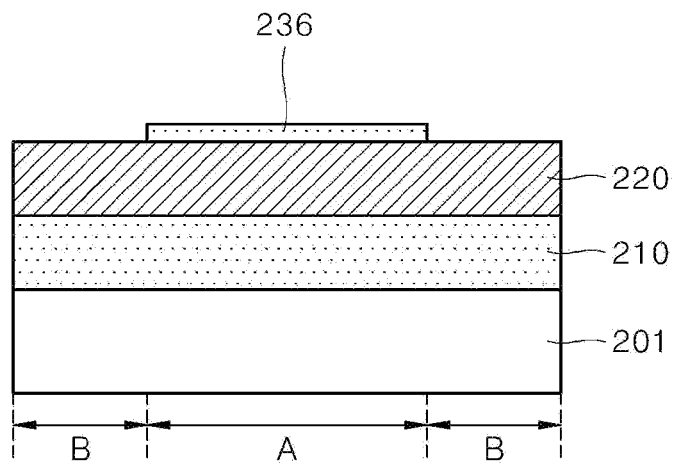
Figure 6C:
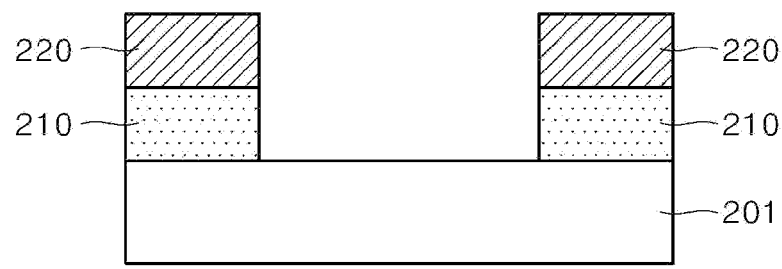

FIGS. 6A to 6C are views schematically showing a method of processing a substrate in yet another embodiment of the present disclosure.

FIGS. 6A to 6C show a method of processing a substrate on which films comprising a first silicon nitride film and a silicon oxide film are consecutively stacked from an outermost side in a first area to be etched, and on which one or more films comprising a second silicon nitride film are stacked from an outermost side in a second area to be non-etched.

In the embodiment, a sacrificial silicon oxide film 236 is formed on the first silicon nitride film 220 in the first area (area A) to be etched, as illustrated in the example of FIG. 6B. The formation of the sacrificial silicon oxide film 236 may involve deposition, oxygen plasma treatment or the formation of a natural oxide film and the like. Results of the formation of the sacrificial silicon oxide film are substantially similar to results of the first etching step in FIG. 5B. That is, FIG. 5B shows a product of the first etching step, and FIG. 6B shows a product of the deposition and the like. However, results of the first etching step and the deposition and the like are substantially similar.

That is, in the embodiment, the sacrificial silicon oxide film 236, the first silicon nitride film 220 and the silicon oxide film 210 in the first area (area A) may be etched together in the following etching step, as illustrated in the example of FIG. 5C, by forming a silicon oxide film corresponding to the above-described residual layer of the first silicon oxide film, based on deposition and the like.

Since a sacrificial silicon oxide film is not formed in the second area (area B) to be non-etched, the silicon nitride film is exposed. Thus, as illustrated in the example of FIG. 5C, the exposed silicon nitride film serves as an etch stopper at the high-temperature etching step to prevent the etching of the silicon nitride film and the films thereunder in the second area (area B).

Some of the features described with reference to FIGS. 3A to 3C may also be applied to the method of processing a substrate in the embodiment.

The sacrificial silicon oxide film may be formed based on methods such as deposition, oxygen plasma, natural oxidation and the like. The step of forming of a sacrificial silicon oxide film may be performed so that the thickness of the sacrificial silicon oxide film 236 is less than a maximum thickness, e.g., 100 Å or less, of the sacrificial silicon oxide film 236 that is removable when the sacrificial silicon oxide film 236 is etched once under the same conditions as those in the etching step.

The etching step may be performed according to the dry etching method using plasma of a mixed gas comprising hydrogen fluoride (HF) gas and ammonia ($NH_3$) gas or a mixed gas comprising nitrogen trifluoride ($NF_3$) gas and ammonia ($NH_3$) gas or hydrogen ($H_2$) gas as etching gas.

Additionally, the etching step may be performed at 60° C. or greater. The etching step may involve repeating a unit cycle comprised of etching and heating a plurality of times. After the etching step, a final heating step of increasing the temperature of a substrate to 200° C. or greater may be further comprised.

In the method of processing a substrate according to the present disclosure, when a silicon nitride film and a silicon oxide film are stacked on a substrate, the silicon nitride film and the silicon oxide film may be etched together in the same chamber, with the dry etching method, as described above.

Additionally, in the method of processing a substrate according to the present disclosure, the silicon nitride film and the silicon oxide film in an area to be etched may be etched together while the films in an area to be non-etched is protected.

Figure 7:
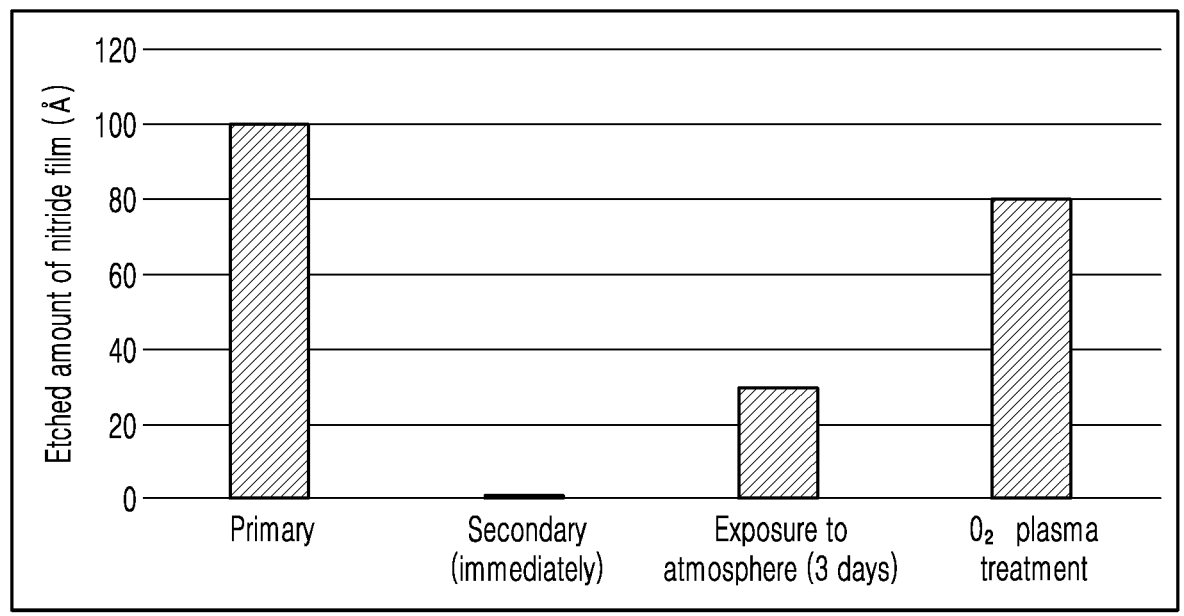
FIG. 7 shows results of a dry etching test in which hydrogen fluoride (HF) and ammonia ($NH_3$) are applied to a silicon nitride film.

For the silicon nitride film, a dry etching test was performed using gas where hydrogen fluoride (HF) and ammonia ($NH_3$) are mixed at a flow rate ratio of 1.5:1. Results of the test are shown in FIG. 7.

At a time of the first etching step, the etched amount of the silicon nitride film was about 100 Å.

Then the second etching step was performed under the following conditions: right after the first etching step, after exposure to the atmosphere right following the first etching step, and after oxygen plasma treatment following the first etching step.

i) Right after the first etching step: Referring to FIG. 7, when the second etching step was performed at 65° C. right after the first etching step, additional etching of the silicon nitride was almost not performed.

ii) After exposure to the atmosphere following the first etching step: Referring to FIG. 7, when the silicon nitride was exposed to the atmosphere for three days after the first etching step, about 25 Å was etched at 65° C. at a time of the second etching step since a natural oxide film was formed on the surface of the silicon nitride during the silicon nitride's exposure to the atmosphere. The natural oxide film on the surface of the silicon nitride may correspond to the above-described residual layer of the first oxide film.

iii) After oxygen plasma treatment following the first etching step: Referring to FIG. 7, when the surface of the silicon nitride was treated with oxygen plasma after the first etching step, about 80 Å was etched at 65° C. at a time of the second etching step since a forced oxide film was formed on the surface of the silicon nitride, based on the oxygen plasma treatment. The oxide film formed on the surface of the silicon nitride in the oxygen plasma processing may correspond to the above-described residual layer of the first oxide film.

That is, results of FIG. 7 reveal that when a natural oxide film or a forced oxide film is on the surface of the silicon nitride, the silicon nitride may be additionally etched, and when such an oxide film is not on the surface of the silicon nitride, the silicon nitride serves as an etch stopper at 60° C. or greater such that the additional etching of the silicon nitride is almost prevented.

The results show that a silicon oxide film and a silicon nitride film to be etched may be etched together with a residual oxide layer, causing almost no etching of a silicon nitride to be non-etched.

The embodiments are described above with reference to a number of illustrative embodiments thereof. However, numerous other modifications and embodiments can be devised by one skilled in the art. The modifications and embodiments within the technical scope of the present disclosure can be included in the scope of the present disclosure. Thus, the scope of the right to the present disclosure should be defined according to the appended claims.

What is claimed is:

1. A method of processing a substrate on which films comprising a first silicon oxide film, a silicon nitride film and a second silicon oxide film are stacked from an outermost side, comprising:
    a first etching step of etching the first silicon oxide film; and
    a second etching step of etching the silicon nitride film and the second silicon oxide film,
    wherein in the first etching step, a residual layer of the first silicon oxide film is left, and
    in the second etching step, the residual layer of the first silicon oxide film, the silicon nitride film and the second silicon oxide film are etched together.

2. The method of claim 1, wherein the first etching step and the second etching step are performed in the same chamber.

3. The method of claim 1, wherein the first etching step is performed until a thickness of the residual layer of the first silicon oxide film is less than a maximum thickness of the first silicon oxide film that is removable when the first silicon oxide film is etched once under the same conditions as those in the second etching step.

4. The method of claim 1, wherein the second etching step is performed according to a dry etching method in which a mixed gas comprising hydrogen fluoride (HF) gas and ammonia ($NH_3$) gas or a mixed gas comprising nitrogen trifluoride (NF3) gas and ammonia ($NH_3$) gas or hydrogen ($H_2$) gas is plasmatized.

5. The method of claim 1, wherein the second etching step comprises repeating a unit cycle that is comprised of etching and heating, a plurality of times.

6. The method of claim 1, wherein the method further comprises a final heating step of increasing a temperature of the substrate to 200 to 250° C. after the second etching step.

7. A method of processing a substrate on which films comprising a first silicon oxide film, a first silicon nitride film and a second silicon oxide film are consecutively stacked from an outermost side in a first area to be etched, and on which one or more films comprising a second silicon nitride film are stacked from an outermost side in a second area to be non-etched, comprising:
    a first etching step of etching the first silicon oxide film in the first area; and
    a second etching step of etching the first silicon nitride film and the second silicon oxide film in the first area at a temperature greater than that of the first etching step,
    wherein in the first etching step, a residual layer of the first silicon oxide film in the first area is left, and
    in the second etching step, the residual layer of the first silicon oxide film, the first silicon nitride film and the second silicon oxide film in the first area are etched together, and the second silicon nitride film in the second area acts as an etch stopper.

8. The method of claim 7, wherein in the second area, a third silicon oxide film is on the second silicon nitride film, and
    in the first etching step, the third silicon oxide film in the second area is etched together with the first silicon oxide film in the first area.

9. The method of claim 7, wherein the first etching step and the second etching step are performed in the same chamber.

10. The method of claim 7, wherein the first etching step is performed until a thickness of the residual layer of the first silicon oxide film is less than a maximum thickness of the first silicon oxide film that is removable when the first silicon oxide film is etched once under the same conditions as those in the second etching step.

11. The method of claim 7, wherein the second etching step is performed according to a dry etching method in which a mixed gas comprising hydrogen fluoride (HF) gas and ammonia ($NH_3$) gas or a mixed gas comprising nitrogen trifluoride (NF3) gas and ammonia ($NH_3$) gas or hydrogen ($H_2$) gas is plasmatized.

12. The method of claim 7, wherein the second etching step is performed at 60° C. or greater.

13. The method of claim 12, wherein the second etching step comprises repeating a unit cycle that is comprised of etching and heating, a plurality of times.

14. The method of claim 13, wherein the method further comprises a final heating step of increasing a temperature of the substrate to 200 to 250° C. after the second etching step.

15. A method of processing a substrate on which films comprising a first silicon nitride film, and a silicon oxide film are consecutively stacked from an outermost side in a first area to be etched, and on which one or more films comprising a second silicon nitride film are stacked from an outermost side in a second area to be non-etched, comprising:

a sacrificial film forming step of forming a sacrificial silicon oxide film on the first silicon nitride film in the first area; and an etching step of etching the first silicon nitride film and the silicon oxide film in the first area, wherein in the etching step, the sacrificial silicon oxide film, the first silicon nitride film and the silicon oxide film in the first area are etched together, and the second silicon nitride film in the second area acts as an etch stopper.

16. The method of claim 15, wherein the sacrificial silicon oxide film forming step is performed so that a thickness of the sacrificial silicon oxide film is less than a maximum thickness of the sacrificial silicon oxide film that is removable when the sacrificial silicon oxide film is etched once under the same conditions as those in the etching step.

17. The method of claim 15, wherein the etching step is performed according to a dry etching method in which a mixed gas comprising hydrogen fluoride (HF) gas and ammonia ($NH_3$) gas or a mixed gas comprising nitrogen trifluoride (NF3) gas and ammonia ($NH_3$) gas or hydrogen ($H_2$) gas is plasmatized.

18. The method of claim 15, wherein the etching step is performed at 60° C. or greater.

19. The method of claim 18, wherein the etching step comprises repeating a unit cycle that is comprised of etching and heating, a plurality of times.

20. The method of claim 19, wherein the method further comprises a final heating step of increasing a temperature of the substrate to 200 to 250° C. after the etching step.

* * * * *